(12) United States Patent
Kawasaki

(10) Patent No.: US 8,084,793 B2
(45) Date of Patent: Dec. 27, 2011

(54) MICROWAVE SEMICONDUCTOR DEVICE USING COMPOUND SEMICONDUCTOR AND METHOD FOR MANUFACTURING THE SAME

(75) Inventor: Hisao Kawasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 12/369,110

(22) Filed: Feb. 11, 2009

(65) Prior Publication Data

US 2009/0250730 A1 Oct. 8, 2009

(30) Foreign Application Priority Data

Apr. 3, 2008 (JP) .................................. 2008-097169

(51) Int. Cl.
*H01L 29/66* (2006.01)

(52) U.S. Cl. . 257/275; 257/280; 257/281; 257/E29.127; 257/E29.311; 257/E29.089

(58) Field of Classification Search .................. 257/275, 257/280, 281, E29.127, E29.311, E29.089
See application file for complete search history.

(56) References Cited

U.S. PATENT DOCUMENTS 7,508,014 B2 * 3/2009 Tanimoto ...................... 257/192

FOREIGN PATENT DOCUMENTS

| JP | 10-178189 | 6/1998 |
| JP | 2005-322811 | 11/2005 |

* cited by examiner

*Primary Examiner* — Bradley K Smith
*Assistant Examiner* — Mohammad T Karimy
(74) *Attorney, Agent, or Firm* — Oblon, Spivak, McClelland, Maier & Neustadt, L.L.P.

(57) ABSTRACT

An undoped AlGaN layer 13 is formed on a buffer layer composed of a GaN series material formed on a semiconductor substrate, a drain electrode 15 and a source electrode 16 forming ohmic junction with the undoped AlGaN layer 13 are formed separately from each other on the undoped AlGaN layer 13. A gate electrode 17 composed of metal Ni and Au laminated in this order is formed between the drain electrodes 15 and the source electrode 16 on the undoped AlGaN layer 13. The end portion 17-2 of the gate electrode 17 is formed on the underlying metal 18 formed by a metal containing Ti via an insulating film 14 on a GaN buffer layer 12 surrounding the undoped AlGaN layer 13.

9 Claims, 8 Drawing Sheets

MICROWAVE SEMICONDUCTOR DEVICE USING COMPOUND SEMICONDUCTOR AND METHOD FOR MANUFACTURING THE SAME

CROSS-REFERENCE TO RELATED APPLICATIONS

This application is based upon and claims the benefit of priority from prior Japanese patent application No. 2008-097169, filed Apr. 3, 2008, the entire contents of which are incorporated herein by reference.

TECHNICAL FIELD

The present invention relates to a semiconductor device using compound semiconductor, especially relates to a semiconductor device using monolithic microwave integrated circuits.

BACKGROUND ART

The present invention relates to a semiconductor device operated in a high-frequency frequency band.

A field effect transistors (herein after abbreviated as FET) using compound semiconductor such as GaN have been widely put in practical use as a semiconductor device operating in microwave frequency band, because it has excellent high-frequency characteristics.

The FET has, for example, a structure described below. A GaN buffer layer is formed on a SiC substrate. An undoped AlGaN layer having an active layer is formed on the GaN buffer layer. A drain electrode and a source electrode, in which Ti, Al, Ni, and Au are laminated in this order, are formed on the undoped AlGaN layer to make an ohmic junction between the undoped AlGaN layer using a liftoff method. Gate electrode composed of metals Pt and Au, which are laminated in this order, or composed of metals Ni and Au, which are laminated in this order, is formed between the drain electrode and the source electrode to make a Schottky junction with the undoped AlGaN layer also using the liftoff method.

However, adherence between GaN layer and Pt or between GaN layer and Ni is not good, because reactivity between GaN layer and Pt or between GaN layer and Ni are not good in the FETs. Therefore, there has been a problem that gate electrode formed by the liftoff method is peeled off easily.

A method is known for forming gate electrode with a vapor deposition at a speed of about 2 to 20 Angstrom/sec, thereby improving the adherence between the gate electrode and GaN layer in order to prevent the defect described above (Japanese Unexamined patent application Publication No. H10-178189).

However, the method descried above is not sufficient to make good adherence when the gate length is decreased for a higher performance FET, because the junction area between the GaN layer and the gate electrode is decreased.

Therefore, one of the objects of the present invention is to provide a semiconductor device which prevents gate electrodes from peeling off.

DISCLOSURE OF THE INVENTION

The semiconductor device according to the present invention includes, a buffer layer composed of GaN series material formed on a semiconductor substrate, an active layer composed of GaN series material formed on the buffer layer, a drain electrode and a source electrode formed separately from each other on the active layer to make an ohmic junction with the active layer, an underlying metal composed of the same material with the drain electrode and the source electrode formed on the buffer layer in the vicinity of the electrodes, and a gate electrode formed between the electrodes and on the active layer to make a Schottky junction with the active layer, at least one end of the gate electrode being extended on the underlying metal.

The semiconductor device according to the present invention includes, a buffer layer composed of GaN series material formed on a semiconductor substrate, an active layer composed of GaN series material formed on the buffer layer, a plurality of drain electrodes and a plurality of source electrodes alternately arrayed on the active layer to make an ohmic junction with the active layer, a plurality of gate electrodes, each of which is formed between each one of the drain electrodes and each one of the source electrodes to make Schottky junction with the active layer, a plurality of source electrode pads formed on the buffer layer and connected with one ends of the plurality of source electrodes, a drain electrode pad formed on the buffer layer facing the plurality of source electrode pads, an underlying metal formed on the buffer layer between the plurality of source electrode pads and the active layer with the same material as the drain electrodes and the source electrodes, a gate electrode connecting line formed on the underlying metal to which each one end of the plurality of gate electrodes is connected, and a plurality of gate electrode pads formed on the buffer layer between each of the source electrode pads each one end of which is connected with the gate electrode connecting line.

DETAILED DESCRIPTION OF THE INVENTION

Hereinafter, embodiments of the present invention will be explained referring to FIGS. 1A to 8C.

First Embodiment

A first embodiment will be explained below referring to FIGS. 1A to 6C.

Figure 1A:
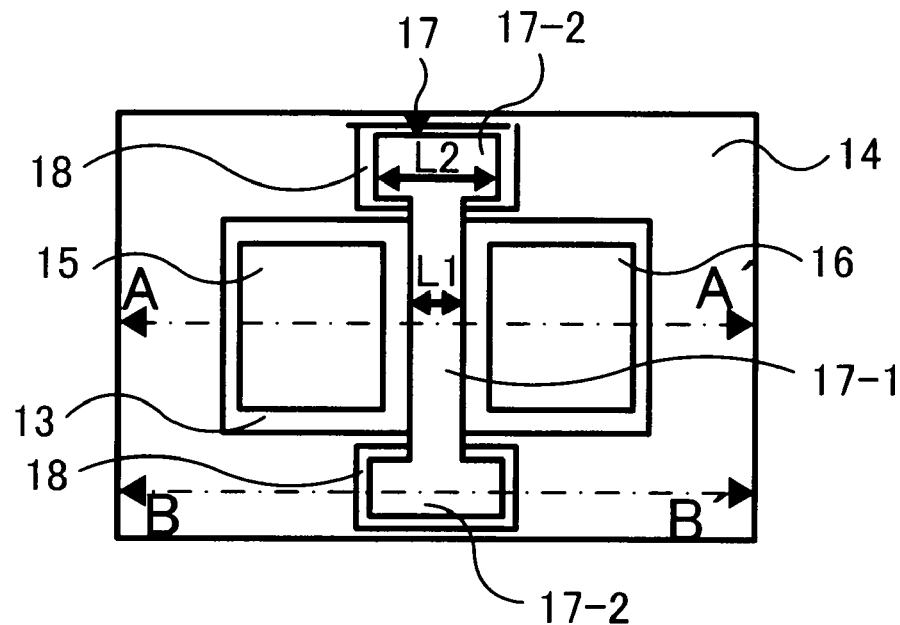
FIG. 1A is a top view showing a semiconductor device according to the first embodiment of the present invention.
Figure 1B:
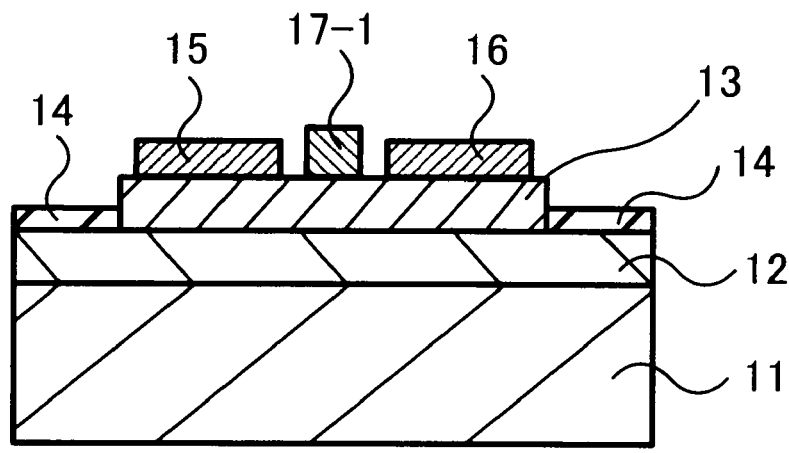
FIG. 1B is a cross-sectional view taken along the broken line A-A' in FIG. 1A.
Figure 1C:
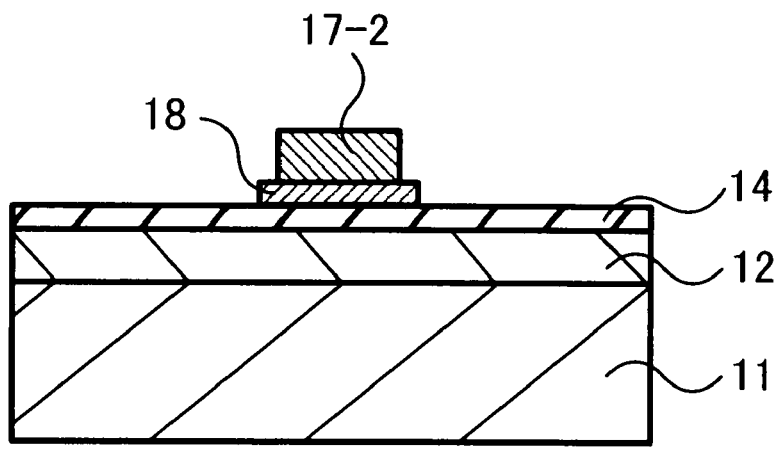
FIG. 1C is a cross-sectional view taken along the broken line B-B' in FIG. 1A.

FIG. 1A is a top view showing a semiconductor device according to a first embodiment. FIG. 1B is a cross-sectional view taken along the broken line A-A' in FIG. 1A. FIG. 1C is a cross-sectional view taken along the broken line B-B' in FIG. 1A.

In the semiconductor device according to the first embodiment, a GaN buffer layer 12 is formed on a semiconductor substrate, which is SiC substrate 11, for example, as shown in FIGS. 1B and 1C. An undoped AlGaN layer 13 which is an active layer is formed in island shape on a portion of the GaN buffer layer 12 as shown in FIG. 1A. On the GaN buffer layer 12 surrounding the undoped AlGaN layer 13, an insulating film 14 composed of SiN, for example, is formed.

A drain electrode 15 and a source electrode 16, each having rectangular shape, are formed separately from each other on the undoped AlGaN layer 13 as shown in FIG. 1A. The drain electrode 15 and source electrode 16 make ohmic junctions with the undoped AlGaN layer 13 respectively, The electrodes 15 and 16 are composed of such metals, for example, as Ti, Al, Ni, and Au, laminated in this order.

An underlying metal 18 is formed on the GaN buffer layer 12 on both sides of a portion between the drain electrode 15 and the source electrode 16 via the insulating film 14. The underlying metal 18 is composed of metal capable of forming ohmic junction with a gate electrode 17, which is described later, and is composed of, for example, the same material as the drain electrode 15 and the source electrode 16. To be more precise, it is a metal formed by laminating Ti, Al, Ni, Au, in this order.

A gate electrode 17 is formed in an area of the undoped AlGaN layer 13 between the drain electrode 15 and the source electrode 16 so as to make Schottky junction with the undoped AlGaN layer 13. Both end portions of the gate electrode 17 are extended on the underlying metal 18 to make ohmic junction with it.

The gate electrode 17 is composed of a central portion 17-1 formed on the undoped AlGaN layer 13 in the area between the drain electrode 15 and the source electrode 16 and both end portions 17-2 connected with the central portion 17-1 and formed on the underlying metal 18, as shown in FIG. 1A. The gate electrode 17 is formed such that the electrode width L2 at the both end portions 17-2 is larger than the electrode width L1 at the central portion 17-1. Here, the electrode width L1, L2 is defined as the length of the gate electrode 17 in the direction along which a drain-source current flows. The gate electrode 17 is composed of Ni and Au metal, for example, laminated in this order.

The underlying metal 18 is thus composed of metal containing Ti that has a good adherence with the GaN buffer layer 12 and makes ohmic junction with the both end portions 17-2 of the gate electrode 17 in the semiconductor device according to the present embodiment. The gate electrode 17 can be adhered and fixed with the underlying metal 18, because the gate electrode 17 is composed of a metal having a good adherence with Ti. Since the gate electrode 17 can be fixed firmly, it is possible to prevent the gate electrode 17 from peeling off from the undoped AlGaN layer 13 in the liftoff process in the manufacturing of the gate electrode 17.

Figure 2A:
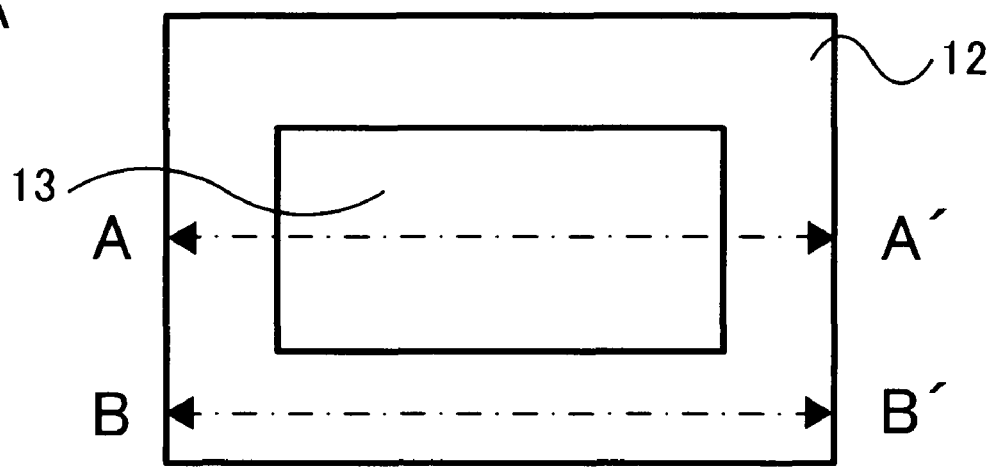
FIG. 2A is a top view of the semiconductor device for explaining a method for manufacturing it according to the first embodiment of the present invention.

A method for manufacturing the semiconductor device according to the first embodiment of the present invention described will be then explained referring to FIGS. 2A to 6C. Here, FIG. 2A shows a top view of a semiconductor device, FIG. 2B shows a cross-sectional view of a semiconductor device. FIG. 2C shows a cross-sectional view of a semiconductor device. These figures correspond to FIG. 1A, FIG. 1B and FIG. 1C respectively. Similar correspondence is seen in FIGS. 3A to 6C.

Figure 2B:
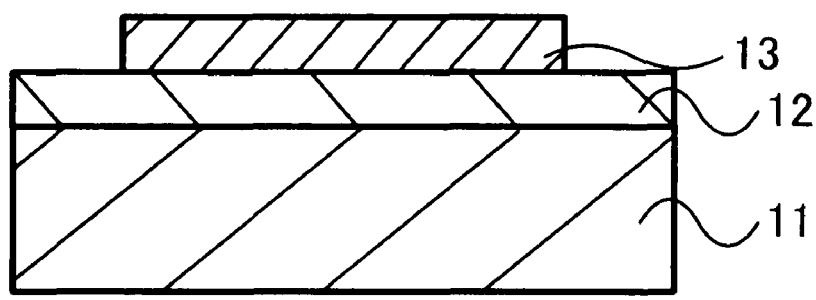
FIG. 2B is a cross-sectional view of the semiconductor device for explaining a method for manufacturing it according to the first embodiment of the present invention.
Figure 2C:
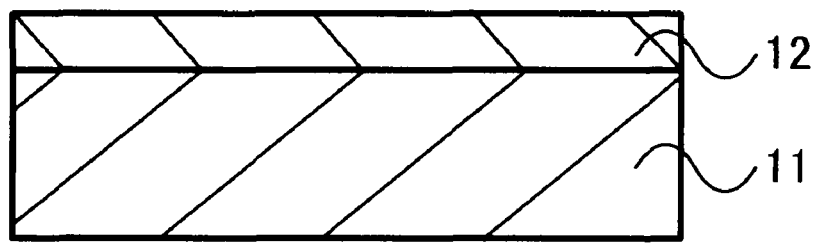
FIG. 2C is a cross-sectional view of the semiconductor device for explaining a method for manufacturing it according to the first embodiment of the present invention.

First, a GaN buffer layer 12 is laminated on an SiC substrate 11 as shown in FIGS. 2A to 2C. An undoped AlGaN layer 13 is then laminated uniformly on the GaN buffer layer 12, and the undoped AlGaN layer 13 is etched away leaving a portion of undoped AlGaN layer 13 of an island shape.

Figure 3A:
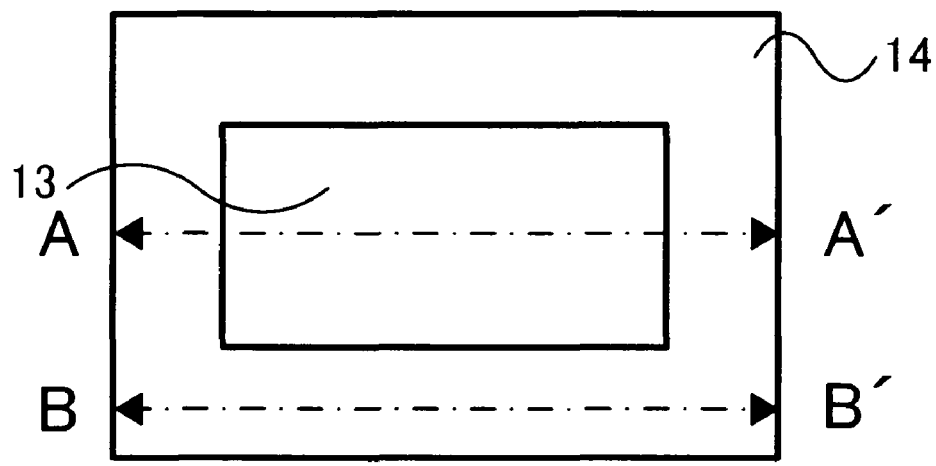
FIG. 3A is a top view of the semiconductor device for explaining a method for manufacturing it according to the first embodiment of the present invention.
Figure 3B:
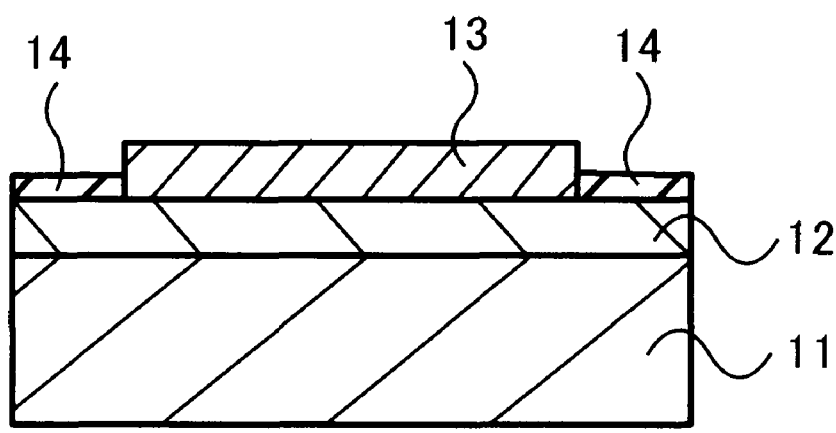
FIG. 3B is a cross-sectional view of the semiconductor device for explaining a method for manufacturing it according to the first embodiment of the present invention.
Figure 3C:
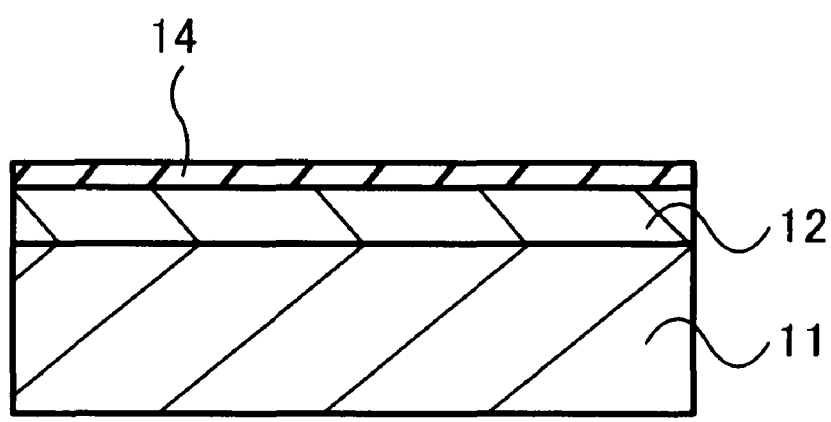
FIG. 3C is a cross-sectional view of the semiconductor device for explaining a method for manufacturing it according to the first embodiment of the present invention.

Next, an insulating film 14 is formed on the GaN buffer layer 12 around the undoped AlGaN layer 13 as shown in FIGS. 3A to 3C.

Figure 4A:
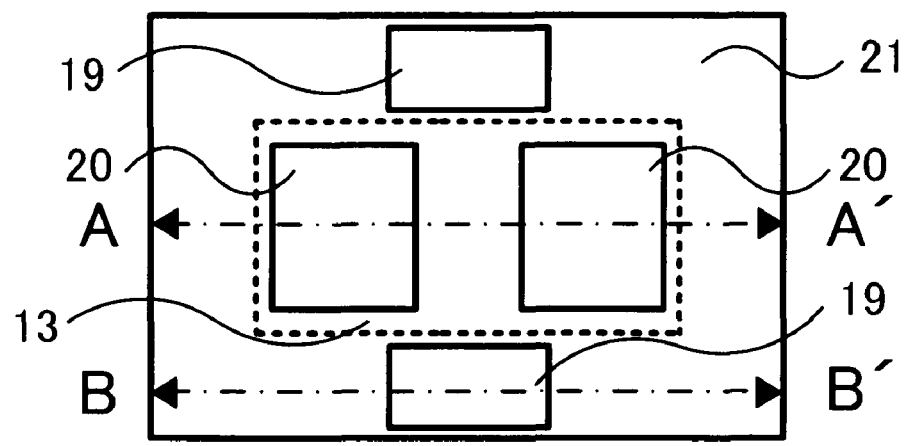
FIG. 4A is a top view of the semiconductor device for explaining a method for manufacturing it according to the first embodiment of the present invention.
Figure 4B:
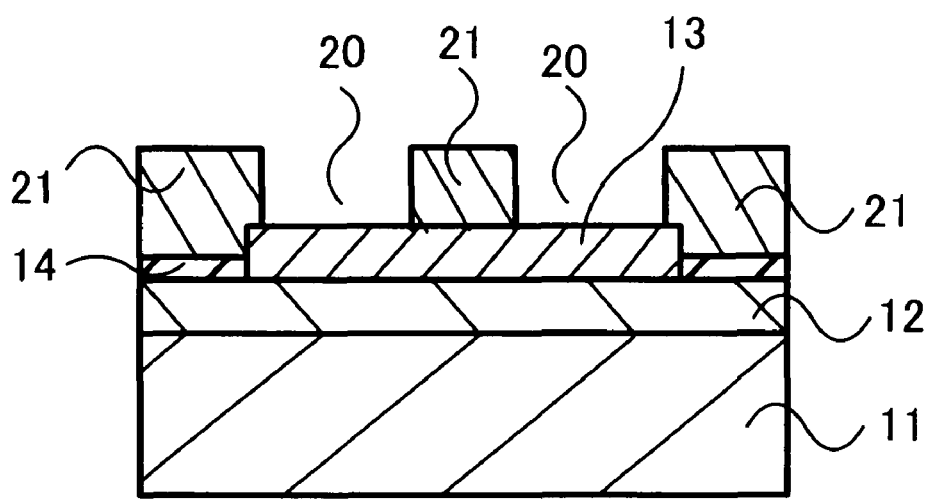
FIG. 4B is a cross-sectional view of the semiconductor device for explaining a method for manufacturing it according to the first embodiment of the present invention.
Figure 4C:
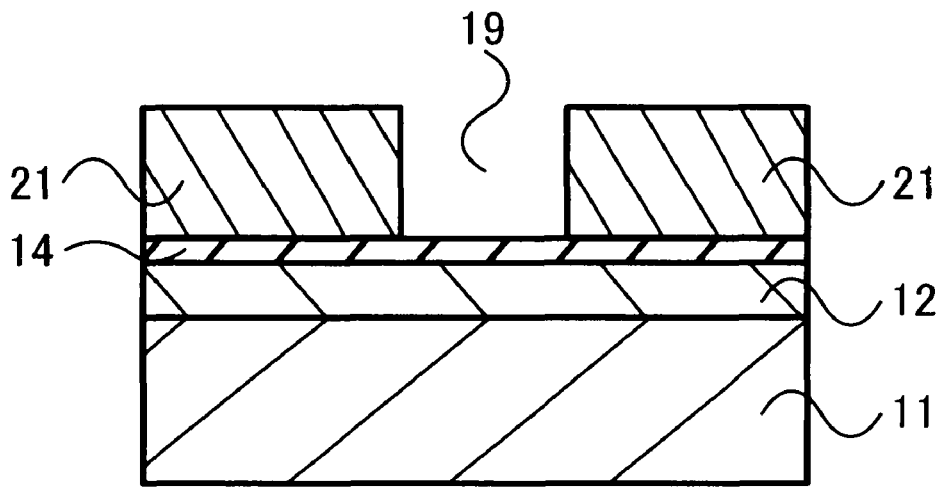
FIG. 4C is a cross-sectional view of the semiconductor device for explaining a method for manufacturing it according to the first embodiment of the present invention.

Next, a first photoresist layer 21 is formed on the GaN buffer layer 12 and on the insulating film 14. The first photo resist layer 21 has a first opening 19 at a portion for forming an underlying metal 18 on the insulating film 14 formed on the GaN buffer layer 12. The first photo resist layer 21 also has a second opening 20 at a portion for forming a drain electrode 15 and a source electrode 16 on the undoped AlGaN layer 13 as shown in FIGS. 4A to 4B. The first opening 19 and the second opening 20 in the first photoresist layer 21 are formed by a patterning process.

Figure 5A:
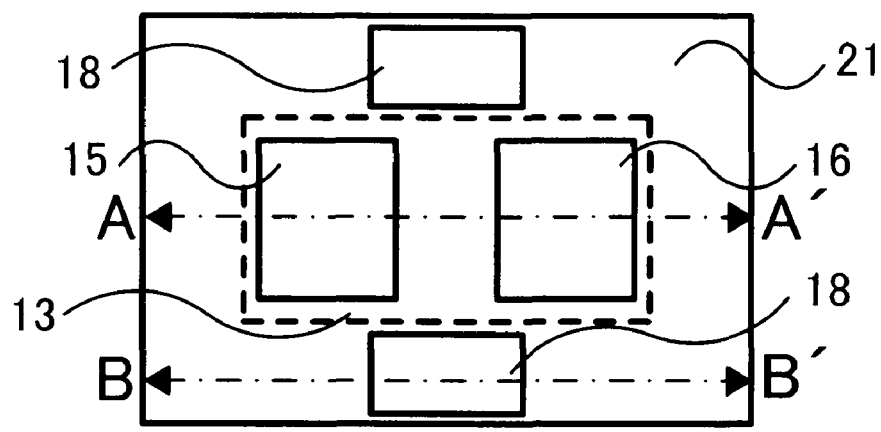
FIG. 5A is a top view of the semiconductor device for explaining a method for manufacturing it according to the first embodiment of the present invention.
Figure 5B:
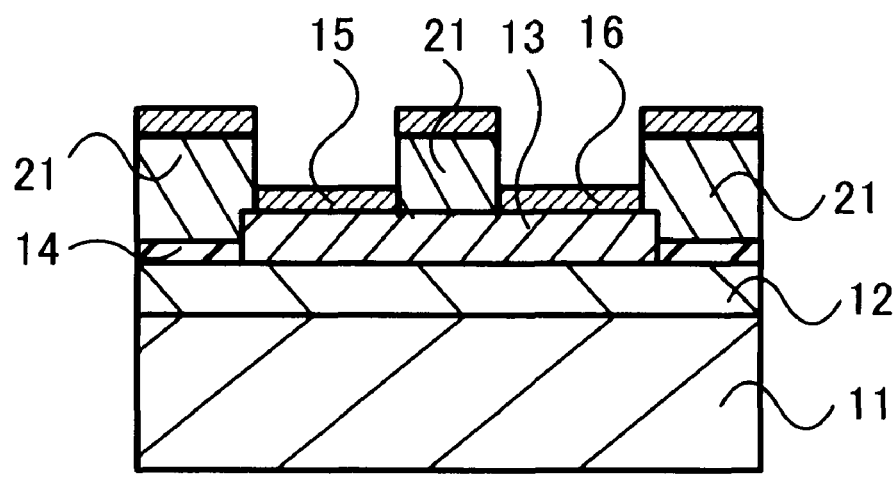
FIG. 5B is a top view of the semiconductor device for explaining a method for manufacturing it according to the first embodiment of the present invention.
Figure 5C:
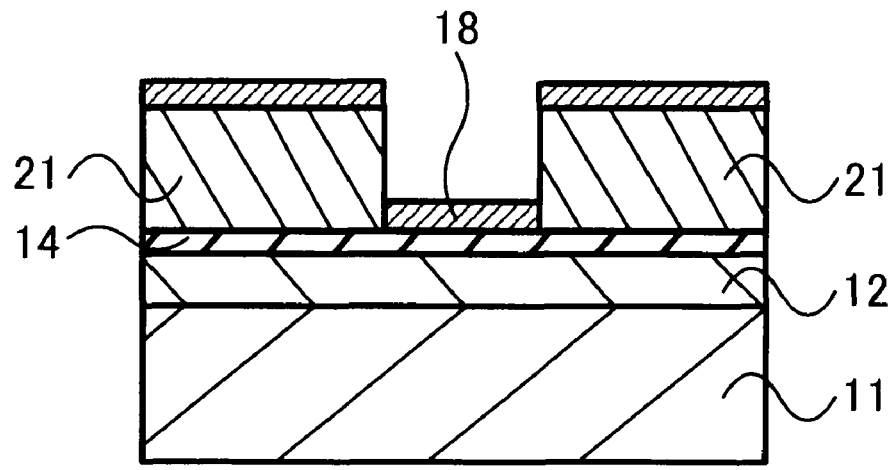
FIG. 5C is a top view of the semiconductor device for explaining a method for manufacturing it according to the first embodiment of the present invention.

Ti, Al, Ni, Au are then laminated in this order on the whole area of the first photoresist layer 21 to form the drain electrode 15 and the source electrode 16 and at the same time to form the underlying metal 18 using a vapor deposition process, as shown in FIGS. 5A to 5B.

Figure 6A:
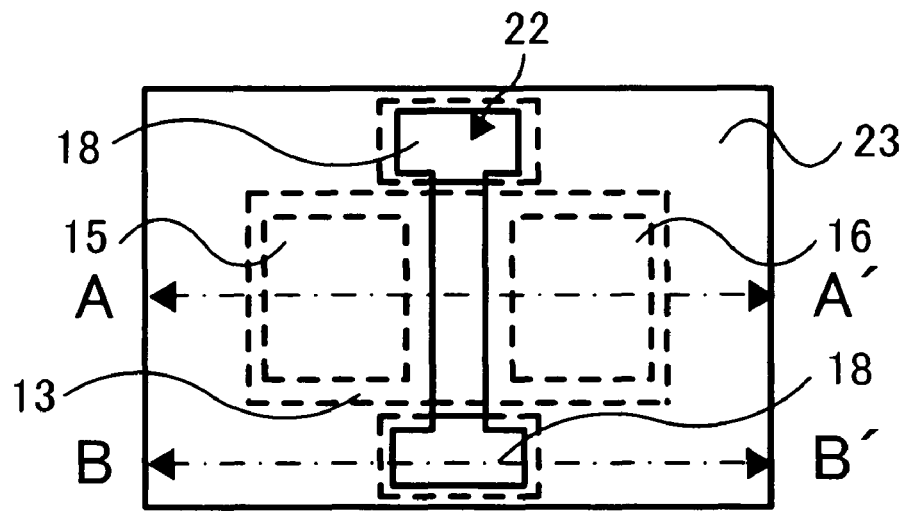
FIG. 6A is a top view of the semiconductor device for explaining a method for manufacturing it according to the first embodiment of the present invention.
Figure 6B:
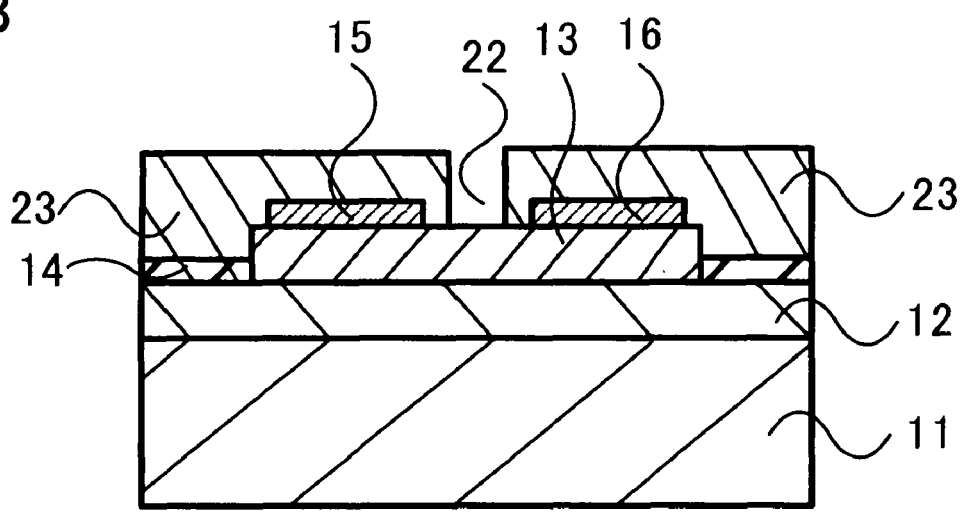
FIG. 6B is a top view of the semiconductor device for explaining a method for manufacturing it according to the first embodiment of the present invention.
Figure 6C:
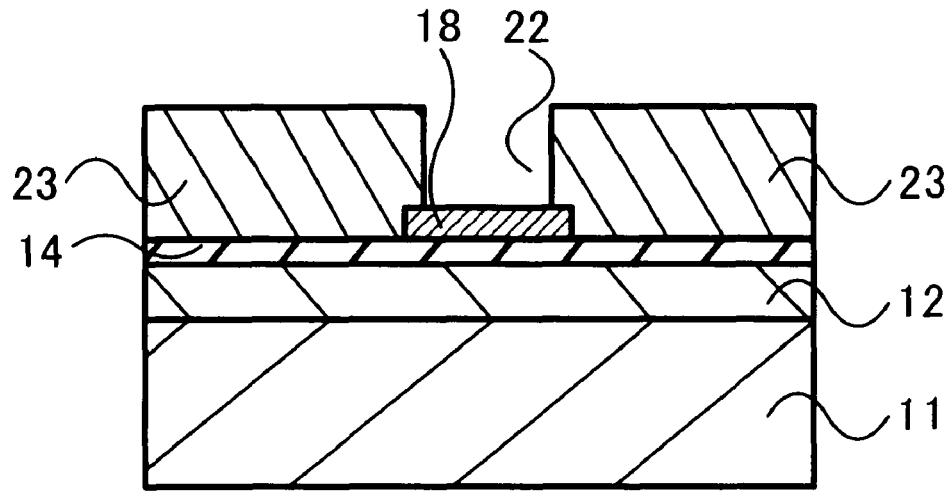
FIG. 6C is a top view of the semiconductor device for explaining a method for manufacturing it according to the first embodiment of the present invention.
Figure 7:
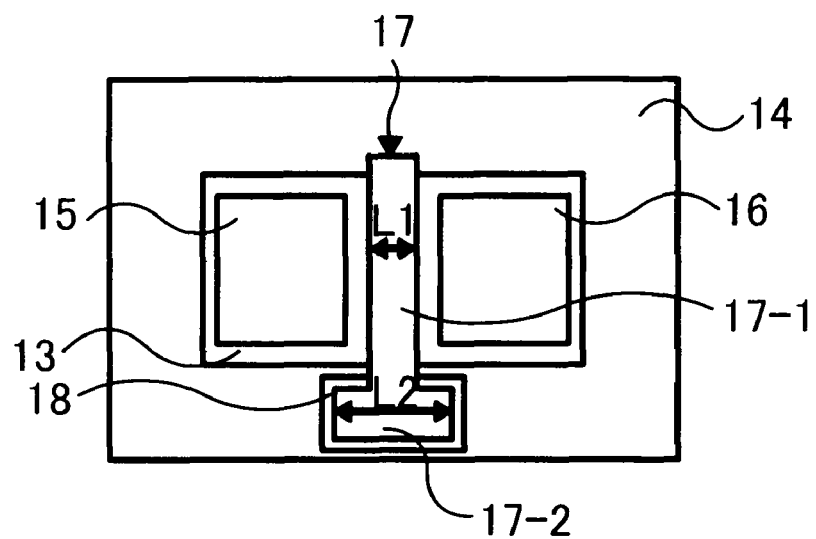
FIG. 7 is a top view showing a modified example of the first embodiment.

A second photo resist layer 23 is formed on the insulating film 14 and on the undoped AlGaN layer 13 so as to cover the drain electrode 15 and the source electrode 16 after removing the first photoresist layer 21, as shown in FIGS. 6A to 6B. The second photo resist layer 23 has a third opening 22 at a portion for forming the gate electrode 17.

Finally, the gate electrode 17 is formed by laminating Ni, Au in this order on the whole area of the second photoresist layer 23 on which the third opening 22 is formed using the vapor deposition process, and then the second photo resist layer 23 is removed with a liftoff process. Thus, the semiconductor device is completed as shown in FIGS. 1A to 1C. Here, the end portion 17-2 of the gate electrode 17 is firmly fixed to the underlying metal 18. Therefore, the second photo resist layer 23 can be removed without peeling off the gate electrode 17.

Here, the semiconductor device according to the first embodiment of the present invention described can exhibit similar effect as mentioned above, even if the gate electrode 17 is composed of the central portion 17-1 and either one of the end portions 17-2.

Second Embodiment

Next, a semiconductor device according to a second embodiment of the present invention will be explained referring to FIGS. 8A to 8C.

Figure 8A:
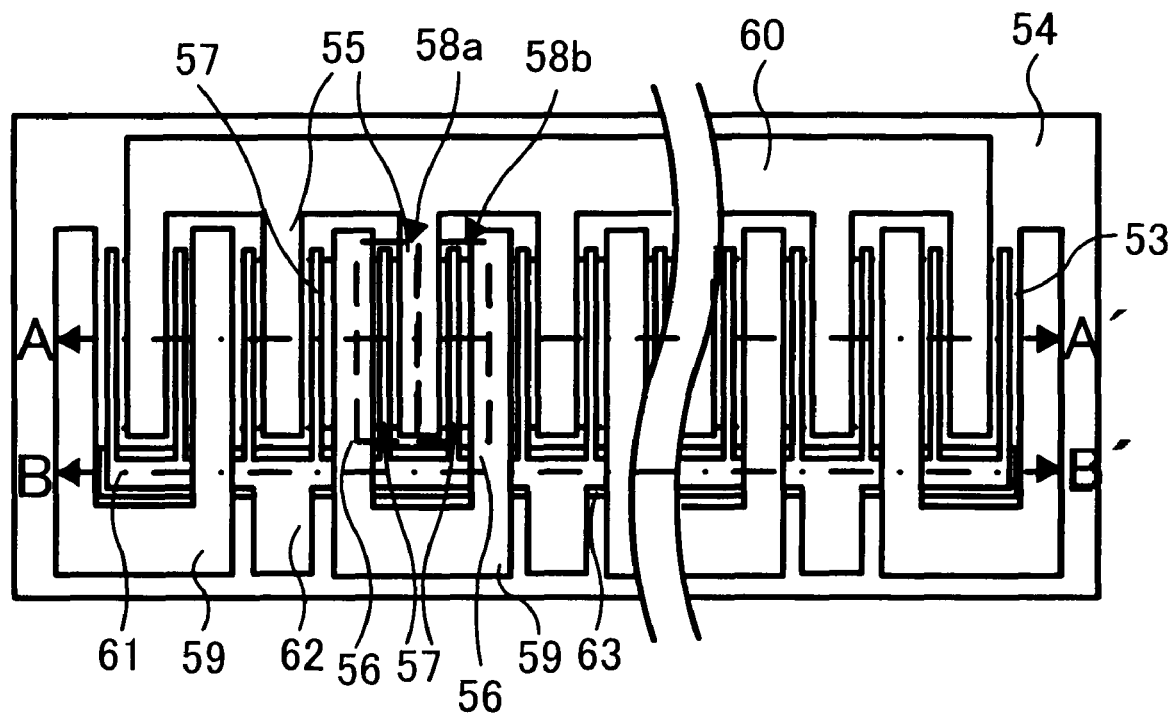
FIG. 8A is a top view showing a semiconductor device according to the second embodiment.
Figure 8B:
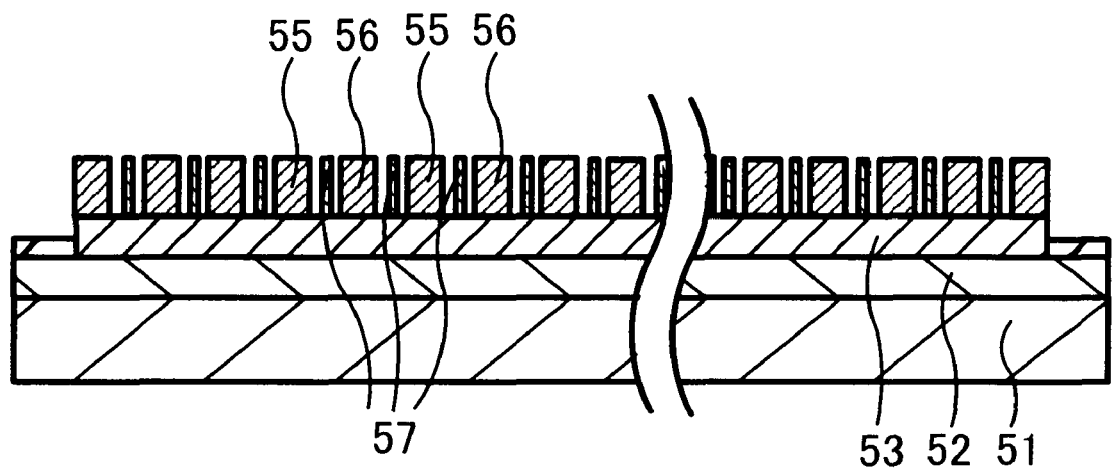
FIG. 8B is a cross-sectional view taken along the broken line A-A' in FIG. 8A.
Figure 8C:
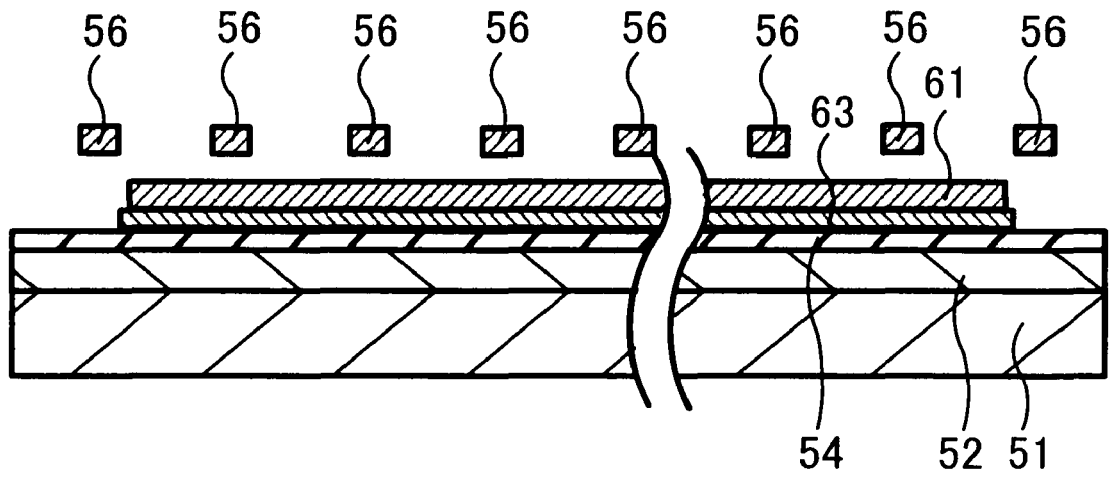
FIG. 8C is a cross-sectional view taken along the broken line B-B' in FIG. 8A.

FIG. 8A is a top view showing the semiconductor device according to the second embodiment, FIG. 8B is a cross-sectional view taken along the broken line A-A' in FIG. 8A, and, FIG. 8C is a cross-sectional view taken along the broken line B-B' in FIG. 8A.

In the semiconductor device according to the second embodiment, a GaN buffer layer 52, and an undoped AlGaN layer 53, which is an active layer, are laminated in this order on a semiconductor substrate, which is a SiC substrate 51, for example, as shown in FIGS. 8B and 8C. An insulating film 54 composed of SiN, for example, is formed on a GaN buffer layer 52 surrounding the undoped AlGaN layer 53.

A drain electrode 55, a source electrode 56, and a gate electrode 57, each composing a plurality of elemental FETs 58 are formed on the undoped AlGaN layer 53. A plurality of drain electrodes 55 and a plurality of source electrodes 56 are so formed that they are alternately arrayed on the undoped AlGaN layer 53, and each of gate electrodes 57 is formed between these drain electrodes 55 and source electrodes 56. Here, the drain electrodes 55 and the source electrodes 56 make ohmic junction with the undoped AlGaN layer 53, which are composed of metals, for example, Ti, Al, Ni, and Au, laminated in this order. The gate electrode 57 make Schottky junction with the undoped AlGaN layer 53, which are composed of metals Ni, Au laminated in this order. In the semiconductor device according to the second embodiment, for example, one hundred elemental FETs are connected in parallel to form a single FET as a whole as descried below.

To be more precise, when attention is paid to an arbitrary element FETs 58A and 58B which are placed adjacent to each other in FIG. 8A and are surrounded by a dotted line in FIG. 8A, the drain electrodes 55 or the source electrodes 56 are formed in common with the FETs 58A and 58B. Namely, one end of each source electrode 56 is connected with a source electrode pad 59 formed on the GaN buffer layer 52 via the insulating film 54. One ends of the drain electrode 55 is connected with a drain electrode pad 60 formed at a portion facing a plurality of source electrode pads 59 on the GaN buffer layer 52 via the insulating film 54. One end of each gate electrodes 57 is connected with a gate connecting line 61 formed at a portion facing the drain electrode pad 60 on the GaN buffer layer 52 between a plurality of source electrode pads 59 and the undoped AlGaN layer 53 via the insulating film 54. The gate connecting line 61 is connected with a plurality of gate electrode pads 62 formed between each of the source electrode pads 59 on the GaN buffer layer 52. Here, the source electrode 56 intersects the gate electrode connecting line 61 with such two-level crossing as an air-bridge structure, for example, wherein the source electrode 56 is insulated from the gate electrode connecting line 61.

Here, the source electrode pad 59 and the source electrode 56 connected therewith are formed integrally. Similarly, the drain electrode pad 60 and the drain electrode 55 are formed integrally. Further, the gate electrode 57, the gate connecting line 61, and the gate electrode pads 62 are formed integrally.

The gate electrode connecting line 61 is formed on an underlying metal 63 formed on the GaN buffer layer 52 via the insulating film 54 in the semiconductor device described above. This underlying metal 63 is composed of metal, which makes ohmic junction with the gate electrode connecting line 61, for example, and which is the same material as the drain electrode 55 and the source electrode 56. More specifically, the metal is composed of Ti, Al, Ni, Au laminated in this order.

As to the method for manufacturing of the semiconductor device according to the second embodiment, a detailed explanation is omitted, because it is similar to that of the semiconductor device according to the first embodiment. However, the source electrode 56, the source electrode pad 59, the drain electrodes 55, the drain electrode pad 60, the gate electrode 57, the gate connecting line 61 and the underlying metal 63 can be formed by vapor deposition process through a photo resist layer having openings corresponding to each components, removing the photo rest layer after the deposition is completed.

In such semiconductor device according to the second embodiment, the underlying metal 63 is made of a metal containing Ti having a good adherence with the GaN buffer layer 52, and the underlying metal 63 and the gate connecting line 61 make ohmic junction. The gate electrode connecting line 61 can be fixed by being adhered to the underlying metal 63, because the gate electrode connecting line 61 is composed of a metal having a good adherence with Ti. Therefore, in the liftoff process for integrally forming the gate electrode 57, the gate electrode connecting line 61 and the gate electrode pads 62, it is possible to prevent the gate electrode 57 from peeling off from the GaN buffer layer 52, because the gate connecting line 61 can be fixed tight to the underlying metal 63.

Here, each of the source electrode pads 59, the drain electrode pads 60 and each of the gate electrode pads 62 may be composed of such metals as Ti, Pt, Au laminated in this order, for example.

Embodiments of the present invention have been described above. However, embodiments are not limited to these embodiments.

For example, the undoped AlGaN layer 13, 53 were formed in the island shape on the GaN buffer layer 12, 52, in each embodiments. This is for the purpose of preventing electric current from flowing between the end portion 17-2 of the gate electrode and the drain electrode 15 or the source electrode 16 in the first embodiment. However, an element isolation layer may be formed on the GaN buffer layer 12, 52 surrounding the undoped AlGaN layer 13, 53. This element isolation layer is formed after the undoped AlGaN layer 13, 53 is formed uniformly on the GaN buffer layer 12, 52, by passivating the region surrounding the area for active layer of the undoped AlGaN layer 13, 53, by using isolation process. In this case, the underlying metal 18, 63 are formed on the element isolation layer via the insulating film 14.

Further, in the first embodiment, the undoped AlGaN layer 13 may be formed uniformly on the GaN buffer layer 12. In this case, the end portion 17-2 of the gate electrode is formed on the undoped AlGaN layer 13 via the underlying metal 18. Therefore, the region in which the central portion 17-1 of the gate electrode is formed and the region the end portion 17-2 of the gate electrode is formed should be insulated to each other in the undoped AlGaN layer 13. This may be applied to the second embodiment in the similar manner.

In the above embodiments, the underlying metal 18, 63 are formed on the GaN buffer layer 12, 52 via the insulating film 14, 54. However, the underlying metal 18, 63 may be formed on the GaN buffer layer 12, 52, on the undoped AlGaN layer 13, 53 or on the element isolation layer without intervening the insulating film 14, 54.

In the above embodiments, the gate electrode 17, 41, 57 was composed of metal Ni, Au laminated in this order. However, a metal Pt, Au laminated in this order may be used with similar advantages.

In each embodiments, the underlying metal 18, 63 was composed of such metals as Ti, Al, Ni and Au laminated in this order. However, an ohmic metal having good adherence property with GaN layer may be used with similar advantages.

The semiconductor substrate is not limited to SiC substrate 11, 51 in each of the embodiment above but may be made of sapphire etc. which are generally used. The GaN buffer layer 12, 52 may be replaced by a passivated buffer layer.

In the semiconductor device according to the second embodiment, the number of the source electrode 56 connected with the source electrode pad 59 was two, however the number of the electrodes connected with the source electrode 56 is not limited to two but may be more than two. Further, the drain electrode pad 60 and the gate connecting line 61 may be split into a plurality of portions.

What is claimed is:

1. A microwave semiconductor device comprising:
   a buffer layer composed of GaN series material formed on a semiconductor substrate;
   an active layer composed of GaN series material formed on the buffer layer, a drain electrode and a source electrode formed separately from each other on the active layer to make an ohmic junction with the active layer;
   underlying metal composed of the same material as the drain electrode and the source electrode formed at a portion out of the active layer on the buffer layer; and
   a gate electrode formed between the drain electrode and the source electrode on the active layer to make a Schottky junction with the active layer, at least one end of the gate electrode being extended on the underlying metal.

2. The microwave semiconductor device according to claim 1, wherein the active layer is formed by an undoped AlGaN layer, the drain electrode and the source electrode are formed by a metal composed of Ti, Al, Ni, Au laminated in this order, and the underlying metal contains at least Ti.

3. The microwave semiconductor device according to claim 1, wherein the gate electrode is formed by any one of material composed of such metals as Ni and Au laminated in this order, or composed of such metals as Pt and Au laminated in this order.

4. The microwave semiconductor device according to claim 1, wherein the underlying metal is formed by a metal composed of Ti, Al, Ni, Au laminated in this order.

5. The microwave semiconductor device according to claim 1, wherein the both ends of the gate electrode are extended onto the underlying metal.

6. The microwave semiconductor device according to claim 1, wherein an element isolation layer is formed on the buffer layer surrounding the active layer, and the underlying metal is formed on the element isolation layer.

7. The semiconductor device according to claim 1, wherein only one end of the gate electrode is formed by extending on the underlying metal.

8. The microwave semiconductor device according to claim 1, wherein an insulating film is formed on the buffer layer surrounding the active layer, and the underlying metal is formed on the insulating film.

9. The microwave semiconductor device according to claim 1, wherein the width of the gate electrode formed on the underlying metal is larger than the width of the gate electrode formed on the active layer.

* * * * *